US009159479B2

(12) United States Patent
Rotem

(10) Patent No.: US 9,159,479 B2
(45) Date of Patent: Oct. 13, 2015

(54) MAGNETIC ENCLOSURE AND METHOD

(71) Applicant: Haim Rotem, Nahariya (IL)

(72) Inventor: Haim Rotem, Nahariya (IL)

(*) Notice: Subject to any disclaimer, the term of this patent is extended or adjusted under 35 U.S.C. 154(b) by 0 days.

(21) Appl. No.: 14/174,582

(22) Filed: Feb. 6, 2014

(65) Prior Publication Data

US 2014/0152409 A1 Jun. 5, 2014

Related U.S. Application Data

(63) Continuation of application No. PCT/IL2012/000289, filed on Aug. 1, 2012.

(60) Provisional application No. 61/522,262, filed on Aug. 11, 2011.

(30) Foreign Application Priority Data

Aug. 7, 2011 (IL) .......................................... 214482

(51) Int. Cl.
*H01F 7/02* (2006.01)
*G01R 33/383* (2006.01)
*G01R 33/38* (2006.01)

(52) U.S. Cl.
CPC ................ *H01F 7/02* (2013.01); *G01R 33/383* (2013.01); *H01F 7/0278* (2013.01); *G01R 33/3806* (2013.01)

(58) Field of Classification Search
CPC .... G01R 33/383; G01R 33/3806; H01F 7/02; H01F 7/0278
USPC .......... 335/296, 302–306; 336/227, 229, 230; 505/211–213
See application file for complete search history.

(56) References Cited

U.S. PATENT DOCUMENTS

| | | | |
|---|---|---|---|
| 4,816,796 A | 3/1989 | Miyajima et al. |
| 4,837,542 A | 6/1989 | Leupold |
| 4,998,976 A | 3/1991 | Rapoport |
| 5,014,032 A | 5/1991 | Aubert |
| 5,337,472 A | 8/1994 | Leupold et al. |
| 5,382,936 A | 1/1995 | Leupold et al. |
| 5,428,334 A | 6/1995 | Leupold et al. |
| 5,428,335 A | 6/1995 | Leupold et al. |
| 5,621,324 A | 4/1997 | Ota et al. |
| 6,856,224 B1 | 2/2005 | Leupold |
| 7,199,689 B1 | 4/2007 | Abele |
| 7,400,147 B2 | 7/2008 | Rapoport |
| 7,719,279 B2 | 5/2010 | Rapoport |
| 2005/0258833 A1 | 11/2005 | Goto et al. |
| 2009/0085700 A1 | 4/2009 | Lian et al. |

OTHER PUBLICATIONS

International Search Report (ISR) and International Preliminary Report on Patentability (IPRP) dated Oct. 30, 2012 (in English) issued in International Application No. PCT/IL2012/000289.

*Primary Examiner* — Bernard Rojas
(74) *Attorney, Agent, or Firm* — Holtz, Holtz, Goodman & Chik PC

(57) ABSTRACT

A magnetic enclosure providing a uniform magnetic field in a test chamber and comprising substantially identical first north magnetic structure and second south magnetic structures that are disposed in geometric mirroring symmetry opposite to each other and separated by an air gap forming the test chamber. Each magnetic structure includes a cap-like permanent magnet assembly covering a convex ferromagnetic pole piece, a ferromagnetic cap-like shield covering the magnet assembly, and a ferromagnetic ring. The ring is in contact with and intermediate the shield of the first and of the second magnetic structure, and has at least one aperture allowing access to the test chamber.

34 Claims, 8 Drawing Sheets

MAGNETIC ENCLOSURE AND METHOD

CROSS REFERENCE TO RELATED APPLICATION

This application claims priority under 35 U.S.C. §119(e) of International Patent Application No. PCT/IL2012/000289 filed Aug. 1, 2012, the entire disclosure of which is incorporated by reference herein.

TECHNICAL FIELD

The present disclosure relates to magnetic enclosures, and more particularly, to an assembly of two identical spaced apart cap-like permanent magnetic structures disposed in geometric mirroring symmetry for providing a homogeneous magnetic field therebetween.

BACKGROUND ART

Magnetic enclosures per se are well known in the art, such as disclosed in the background patents hereinbelow.

U.S. Pat. No. 4,998,976 to Uri Rapoport, discloses a principal permanent magnet and auxiliary permanent magnet means disposed perpendicular to one another.

U.S. Pat. No. 5,014,032 to Guy Aubert recites a cylindrical permanent magnet with a longitudinally induced magnetic field having two annular structures magnetized on the one hand radially with respect to the cylinder axis and on the other hand anti-symmetrically, but is silent about any pole piece for the return of the induction flux from one pole to the other pole.

US Patent Application No. 2005/258833 to Goto Takao et al. discloses use of a plurality of auxiliary magnets that are disposed around main magnets to adjust the interval between the main magnet and the auxiliary magnets and to shape static magnetic fields.

U.S. Pat. No. 5,337,472 to Herbert A. Leupold divulges methods of manufacturing rings, cylinders, hemispheres and spheres having a relatively strong central working field within a central working space.

U.S. Pat. No. 5,621,324 to Kimiharu Ota et al. recite a magnet field generating apparatus comprising a plurality of permanent magnet assemblies disposed continuously around the angular inner circumference of a hexagonal tubular yoke to provide a uniform magnetic field at the center portion of the hollow space inside said permanent magnet assemblies.

U.S. Pat. No. 7,199,689 to Manlio Abele divulges a magnetic structure for generating a uniform magnetic field without the need of an external ferromagnetic yoke, where the magnetic structure serves to carry only part of the return flux of the induction from one pole of the magnetic structure to the other pole.

In U.S. Pat. No. 7,400,147 to Uri Rapoport, there is recited an arrangement of at least six side-magnets and at least two main-magnets.

U.S. Patent No. 2009/0085700 to Jianyu Lian et al. divulges a main assembly of cylindrical geometry with permanent magnets for magnetic field sources that are composed of two regions, a central disk-like portion magnetized substantially along the axial direction and an outer ring-like region magnetized substantially along the radial direction extending axially to form part of a pole.

However, relative to the background art, the embodiments described hereinbelow provide a better ratio of energy stored in magnetic material over magnetic field intensity in a volume of interest.

Technical Problem

In many domains, such as for example in the field of NMR/MRI equipment, (Nuclear Magnetic Resonance/Magnetic Resonance Imaging) there is a quest for permanent magnetic enclosures configured as efficient, compact, and strong magnetic field sources able to provide a uniform magnetic field in a test chamber.

Solution to Problem

A solution to the problem is provided by a magnetic enclosure and by a method approximating an ideal model 100, which model includes two identical hemispherical magnetic structures disposed in geometric mirroring symmetry opposite to each other and separated apart by an air gap, which forms a test chamber therebetween.

FIG. 1A is a partial cross section of the ideal model 100 of a magnetic enclosure 1000 having a north portion N, which is separated apart by the air gap AG from a south portion S. A belt 40, coupled to the north and south portions, respectively N and S, surrounds and encloses a test chamber 50. Elements pertaining to the north portion and to the south portion are indicated with the prefix, respectively N and S. Structurally, the north portion N and the south portion S are identical magnetic structures ST, respectively NST and SST, disposed in geometric mirroring symmetry opposite to each other and separated apart by the test chamber 50. The volume of the test chamber 50 is delimited between the north and the south portions, respectively NST and SST, and the belt 40. Access to the test chamber 50 is provided by at least one opening or aperture AP disposed at least in the belt 40.

Each magnetic structure ST includes three elements assembled in close abutting contact with each other to form a hemisphere of solid material. The three elements include a hollow hemisphere 10 of permanent magnetic material capping a solid hemispherical pole piece 20, and a hollow hemispheric shield 30 capping the permanent magnetic hollow hemisphere 10. This means that there are a hollow north permanent magnetic hemisphere N10, a solid north hemispherical pole piece N20, and a hollow north hemisphere shield N30, and disposed in geometric mirroring symmetric disposition thereto, the same elements in the south structure, respectively, a hollow south permanent magnetic hemisphere S10, a solid south hemispherical pole piece S20, and a hollow south hemisphere shield S30. A numeral referring to an element pertaining to the north portion N is marked with the prefix N, and a numeral referring to an element of the south portion S is indicated with the prefix S, even if not specifically described or shown as such in a Fig.

Both the pole piece 20 and the shield 30 are made of ferromagnetic material. The pole piece 20 is nested into the permanent magnetic hollow hemisphere 10, which in turn is nested into the hollow hemispheric shield 30. The pole piece 20 has an equatorial planar surface 21 and the hollow hemisphere magnet 10 and the shield 30 terminate in, respectively, a magnet rim 12 and a shield rim 31. The equatorial planar surface 21, the magnet rim 12, and the shield rim 31 form a wall 51 of the test chamber 50.

The belt 40 bridges and couples the north shield rim N31 to the south shield rim S31, and the interior surface 52 of the belt 40 forms the lateral boundaries of the test chamber 50 together with the north and south walls of the test chamber, respectively N51 and S51.

FIG. 1B shows the flow of lines of magnetic flux F in the ideal model 100 of the magnetic enclosure 1000. The "ideal" permanent magnet north hemisphere N10 is magnetized to have a polarity oriented in converging radial direction, as shown by the arrows marked F in FIG. 1A. FIG. 1B further shows the resultant flux lines also indicated by the arrows marked F. From the permanent magnet N10, the lines of magnetic flux are received in radial converging distribution on the convex portion N23 of the hemispherical north pole piece N20, which operates as a "magnetic lens" to align the radially incoming lines of magnetic flux into parallel lines exiting perpendicular to the north pole equatorial planar surface N21 of the ferromagnetic north pole piece N20. Next, the parallel lines of magnetic flux cross the test chamber 50, to provide a homogeneous magnetic field therein, and then impinge perpendicular and in parallel on the south pole equatorial planar surface S21.

Similar to the hemispherical north pole piece N20, the hemispherical south pole piece S20 operates as a "magnetic lens" to receive the incoming parallel lines of magnetic flux F for redirection in radial divergence into the hollow permanent magnetic south hemisphere S10, which the magnetic flux lines traverse in radial divergence, and exit from the convex portion S23 and out of the permanent magnetic south hemisphere S10, to cross over to the south shield S30.

The magnetic flux lines return to the north hollow permanent magnetic hemisphere N10 from the south shield S30, via the belt 40, and through the north shield N30, to close the loop of magnetic flux.

Advantageous Effects of Invention

The ideal system 100 described hereinabove is a compact structure providing a homogeneous, stable, and uniform magnetic field in the test chamber 50. However, it is not practical to manufacture a hollow hemisphere 10 of permanent magnetic material. Therefore, the hollow hemisphere 10 is approximated and shaped for example, as a cap-like shell such as a shell of a multi-faced polyhedron. Evidently, the greater the number of faces of the polyhedron, the closer the approximation to the hollow hemisphere 10 of the ideal model 100.

Surprisingly, it turns out that even crude approximations to the ideal hemispherical shape still provide excellent results and feature a homogeneous, stable, and uniform magnetic field in a test chamber.

For example, the hollow hemisphere of permanent magnetic material 10 may be built as a hemi-polyhedral magnetic shell 210, shown in FIG. 3, as an approximation of the hollow hemisphere 10, which hemi-polyhedral magnetic shell is a permanent magnetic structure that may be assembled out of a plurality of pyramidal frusta.

DEFINITIONS

A permanent magnet is an object made from a material that is magnetized and creates its own persistent magnetic field.

Ferromagnetic materials may be divided into magnetically "soft" materials, having low coercivity, like annealed iron, which may be magnetized but do not tend to stay magnetized, and magnetically "hard" materials having high coercivity, which do remain magnetized. Permanent magnets are made from "hard" ferromagnetic materials such as for example alnico and ferrite that are subjected to a powerful magnetic field during manufacture, to align their internal microcrystalline structure.

The term "ferromagnetic material" refers to both ferromagnetic material and ferrimagnetic material.

The terms "pole-piece" or "yoke" and "magnetic shield" or "magnetic shielding" apply to an element made of high permeability material and may be used for multiple tasks, including: a) magnetic confinement, b) strengthening of the magnetic field, and c) improvement of the homogeneity of the magnetic field, mainly by shaping of the pole piece.

The terms "interior" and "exterior" are meant to point to a disposition, respectively closer to and farther away from the center of the magnetic enclosure.

The wording "substantially identical" refers to two permanent magnets being identical but for shimming pieces that may be added to correct the homogeneity of the magnetic field. Alternatively, the wording "substantially identical" is use to indicate two permanent magnets having the same shape but made each one out a different number of pieces of material.

SUMMARY

It is an object of the embodiments of the disclosure described hereinbelow to provide a method and a magnetic enclosure configured to supply a homogeneous, stable, and uniform magnetic field in a test chamber. The magnetic enclosure comprises a first north magnetic structure and a second south magnetic structure that are both substantially identical and are disposed in geometric mirroring symmetry opposite to each other and separated apart by an air gap forming the test chamber. This applies to geometries that have symmetry of improper rotations. Geometric mirror symmetry is advantageous considering the resultant homogeneity of the magnetic field.

It is another object of the embodiments of the disclosure described hereinbelow to provide a magnetic enclosure comprising a north portion substantially identical to a south portion, where both portions are disposed in geometric mirroring symmetry opposite to each other and mutually separated apart by an air gap. Each one of the north portion and of the south portion comprises a permanent magnet shell, a ferromagnetic pole piece, a ferromagnetic shield, and a ferromagnetic ring. The permanent magnet shell is shaped as a shell of a polyhedron to approximate a hemisphere, the permanent magnet shell having a convex magnet exterior surface and a concave magnet interior surface. The ferromagnetic pole piece has a pole piece convex surface that is disposed in abutting contact with the concave magnet interior surface, and has a pole piece base surface. The ferromagnetic shield has a shield rim from which extend a convex shield exterior surface and a concave shield interior surface that is disposed in abutting contact with the convex magnet exterior surface. The ferromagnetic ring is disposed in abutting contact with and intermediate between the shield rim of the north portion and of the south portion to bridge the air gap and to form the test chamber to which access is provided via at least one aperture opened in the ring.

It is yet another object of the embodiments of the disclosure described hereinbelow to provide a permanent magnet shell configured as a hollow hemi-polyhedron having polygonal faces on the convex magnet exterior surface and on the concave magnet interior surface.

It is yet still another object of the embodiments of the disclosure described hereinbelow to provide a north portion that comprises a north shield, a north permanent magnet shell, and a ferromagnetic north pole piece. The north shield has a north convex shield exterior surface joining a north concave shield interior surface at a north shield rim. The north permanent magnet shell has a north convex magnet exterior surface joining a north concave magnet interior surface at a north magnet rim. The ferromagnetic north pole piece has a north pole piece convex surface joining a north pole piece base surface. There is further provided a south portion that comprises a south pole piece, a south permanent magnet shell, and a south shield. The ferromagnetic south pole piece has a south pole piece base surface joining a south pole piece convex surface. The south permanent magnet shell has a south concave magnet interior surface joining a south convex magnet exterior surface at a south magnet rim. The south shield has a south concave shield interior surface joining a south convex shield exterior surface at a south shield rim. The magnetic enclosure further comprises the north permanent magnet shell having magnetization orientations in direction converging radially-like toward the north pole piece, for lines of magnetic flux to radially-like enter the north pole piece convex surface and to exit perpendicular to and in parallel out of the north pole piece base surface into the test chamber. Furthermore, the lines of magnetic flux in the test chamber are substantially parallel and enter the south pole piece base surface to exit radially-like out of the south pole piece convex surface into the south permanent magnet shell. Moreover, the south permanent magnet shell has magnetization orientations in a direction converging radially-like outward toward the south shield, for the lines of magnetic flux to pass out of the south permanent magnet shell to the south concave shield interior surface, wherefrom the lines of magnetic flux continue through the ring and therefrom to the north shield, and from the north concave shield interior surface to the north permanent magnet shell to form a closed magnetic flux circuit between the south portion and the north portion, and to form the homogeneous, stable, and uniform magnetic field in the test chamber.

It is still another object of the embodiments of the disclosure described hereinbelow to provide the north permanent magnet shell and the south permanent magnet shell to form a hollow polyhedron by mutual abutment in aligned disposition of the north magnet rim onto the south magnet rim.

It is still yet another object of the embodiments of the disclosure described hereinbelow to provide the permanent magnet shell as an assembly of a plurality of right pyramidal frusta, where each one pyramidal frustum out of the plurality of pyramidal frusta has a polygonal base disposed in abutting contact with the concave shield interior surface, and a polygonal top disposed in abutting contact with the pole piece convex surface.

It is still yet one object of the embodiments of the disclosure described hereinbelow to provide the concave shield interior surface of the ferromagnetic cap-like shield to be configured so as to cover the convex magnetic exterior surface in abutting contact coverage selected from a group consisting of partial coverage, complete coverage extending flush with the magnet rim, and complete coverage extending beyond the magnet rim.

It is still yet one more object of the embodiments of the disclosure described hereinbelow to provide the concave magnet interior surface of the permanent magnet shell to be configured so as to cover the pole piece convex surface in abutting contact coverage selected from a group consisting of partial coverage, complete coverage extending flush with the pole piece base surface, and complete coverage extending beyond the pole piece base surface.

It is still yet one additional object of the embodiments of the disclosure described hereinbelow to provide the pole piece base surface, the magnet rim, and at least a portion of the shield rim in a configuration appropriate to form a wall of the test chamber, which wall is one of a planar wall and a non-planar wall.

It is still yet one other object of the embodiments of the disclosure described hereinbelow to provide the pole piece to be configured to have a pole piece base surface selected alone and in combination from a group of surfaces including a flat planar surface, a concave surface and a convex surface.

It is further an object of the embodiments of the disclosure described hereinbelow to provide the north portion and the south portion to be aligned in mutual geometric mirroring symmetric disposition along a common axis, which axis crosses a face on the north permanent magnet assembly identical to a face on the south permanent magnet assembly. Furthermore, the ring is disposed intermediate between the north portion and the south portion in concentricity with the common axis, and where the at least one aperture in the ring leads into the test chamber.

It is moreover an object of the embodiments of the disclosure described hereinbelow to provide the ferromagnetic north pole piece and the ferromagnetic south pole piece in a configuration where each one pole piece is configured to operate as a magnetic lens. The magnetic lens operates such that lines of magnetic flux received in radial-like distribution on the north pole piece convex surface are realigned to exit out of the north pole piece base surface in parallel alignment distribution, and lines of magnetic flux received in parallel alignment distribution on the south pole piece base surface are realigned to exit out of the south pole piece convex surface in radial-like distribution.

It is an additional object of the embodiments of the disclosure described hereinbelow to provide each one pyramidal frustum to have a frustum height and an axis of magnetization. The frustum height is a geometrical axis and the axis of magnetization is co-aligned with the geometrical axis. The axis of magnetization of the frusta of the permanent magnet assembly is oriented in radial-like or center oriented direction of the pole piece base surface.

It is a supplementary object of the embodiments of the disclosure described hereinbelow to provide the at least one first aperture to be configured to allow introduction of at least one portion of a test object into the test chamber. Furthermore, at least one second aperture opened in the ring is configured to allow entry and exit into and out of the test chamber, and the at least one second aperture is disposed relative to the at least one first aperture as one of both in linear continuation thereof and in angular disposition thereto.

It is one of the objects of the embodiments of the disclosure described hereinbelow to provide an interior volume that is enclosed by the magnetic enclosure, and where the test chamber, which is delimited by walls and by the interior surface of the ring, is may be the sole void portion of the magnetic enclosure.

It is yet a further object of the embodiments of the disclosure described hereinbelow to provide a magnetic enclosure having two permanent magnet structures providing a homogeneous, stable, and uniform magnetic field in a test chamber. The magnetic enclosure comprises a north portion substantially identical to a south portion disposed in geometric mirroring symmetry opposite to each other and mutually separated apart by an air gap. Each one of the north portion and of the south portion comprises a permanent magnet assembly, a ferromagnetic pole piece, a ferromagnetic shield, and a ferromagnetic ring. The permanent magnet assembly has practically a continuous convex magnet exterior surface and a concave magnet interior surface shaped as a shell of a polyhedron to approximate a hemisphere. The ferromagnetic pole piece is configured as a magnetic lens, the pole piece having a pole piece convex surface disposed in abutting contact with the concave magnet interior surface, and having a pole piece base surface. The ferromagnetic shield has a shield rim from which extends a convex shield exterior surface and a concave shield interior surface that is disposed in abutting contact with the convex magnet exterior surface. The ferromagnetic ring is disposed in abutting contact with and intermediate between the shield rim of the north portion and of the south portion. The ring is configured to form a return path between the two permanent magnet structures, and to provide access to the test chamber via at least one aperture opened in the ring.

It is still an additional object of the embodiments of the disclosure described hereinbelow to provide a magnetic enclosure having two permanent magnet structures providing a homogeneous, stable, and uniform magnetic field in a test chamber. The magnetic enclosure comprises a north portion substantially identical to a south portion disposed in geometric mirroring symmetry opposite to each other and mutually separated apart by an air gap. Each one of the north portion and of the south portion comprises a permanent magnet assembly, a ferromagnetic pole piece, a ferromagnetic shield, and a ferromagnetic ring. The permanent magnet assembly has practically a continuous convex magnet exterior surface and a concave magnet interior surface shaped as a shell of a polyhedron to approximate a hemisphere. The ferromagnetic pole piece is configured appropriately as one of a convergent and a divergent magnetic lens, the pole piece having a pole piece convex surface disposed in abutting contact with the concave magnet interior surface, and having a pole piece base surface. The ferromagnetic shield has a shield rim from which extend a convex shield exterior surface and a concave shield interior surface that are disposed in abutting contact with the convex magnet exterior surface. The ferromagnetic ring is disposed in abutting contact with and intermediate between the shield rim of the north portion and of the south portion, the ring having at least one aperture providing access to the test chamber, and is configured to form a return path between the two permanent magnet structures.

It is still a supplementary object of the embodiments of the disclosure described hereinbelow to provide the pole piece base surface to be disposed so as to protrude away from the shield rim to facilitate access to in between the pole piece base surfaces.

It yet an additional object of the embodiments of the disclosure described hereinbelow to provide the shield rim to be recessed relative to the pole piece base surface to enhance access to an interval separating apart the pole piece base surfaces.

It is one more object of the embodiments of the disclosure described hereinbelow to provide the at least one aperture in the ring to be formed by deleting a portion of the ring.

It is still one more object of the embodiments of the disclosure described hereinbelow to provide the pole piece base surface to be disposed to protrude away from the shield rim, and for the at least one aperture in the ring to be formed by deleting a portion of the ring, whereby access to in between the pole piece base surfaces is facilitated.

BRIEF DESCRIPTION OF DRAWINGS

Exemplary embodiments are illustrated in referenced figures. It is intended that the embodiments and figures disclosed herein be considered as being illustrative, rather than restrictive. The disclosure, however, both as to organization and method of operation, together with objects, features, and advantages thereof, may best be understood by reference to the following detailed description when read with the accompanying figures, in which.

DESCRIPTION OF THE EMBODIMENTS

Instead of the ideal model 100 of a magnetic enclosure 1000 having two hollow hemispheres 10 of permanent magnetic material, as described hereinabove, an approximation of the shape of a hollow hemispheres 10 may be built in the form of a cap-like shell such as for example, a hemi-polyhedral shell. In practice, a hemi-polyhedral shell of permanent magnetic material may be realized as a portion of a shell of a selected hollow polyhedron, such as for example and among others, one of the hollow Platonic, Archimedean, or Catalan solids.

Care must be taken for the north portion N and the south portion S to be identical and to be disposed in geometric mirroring symmetry opposite to each other. It is not always possible to cut a hollow polyhedron into two portions and to obtain two identical shells, although that may be the case, such as for a cube for example. However, it is always possible to duplicate one of the cut portions to thereby ascertain provision of identical north and south portions, respectively N and S, to be disposed in geometric mirroring symmetry. In some cases, a hollow polyhedron may be cut into two portions and actually provide two identical portions but to achieve geometric mirroring symmetry, the rotation of one portion relative to the other one about a common axis is required as may be the situation with say, a hollow cuboctahedron.

A hollow cube, as one of the hollow Platonic solids, is an example of a polyhedron that when appropriately cut parallel to a face into to portions, provides two identical portions that may be disposed in geometric mirroring symmetry, where each portion presents five external faces. Out of the hollow Platonic solids, the cube, the dodecahedron, and the icosahedron may be preferred over two tetrahedra or an octahedron, since they provide a better approximation of a hollow hemisphere.

Figure 1A:
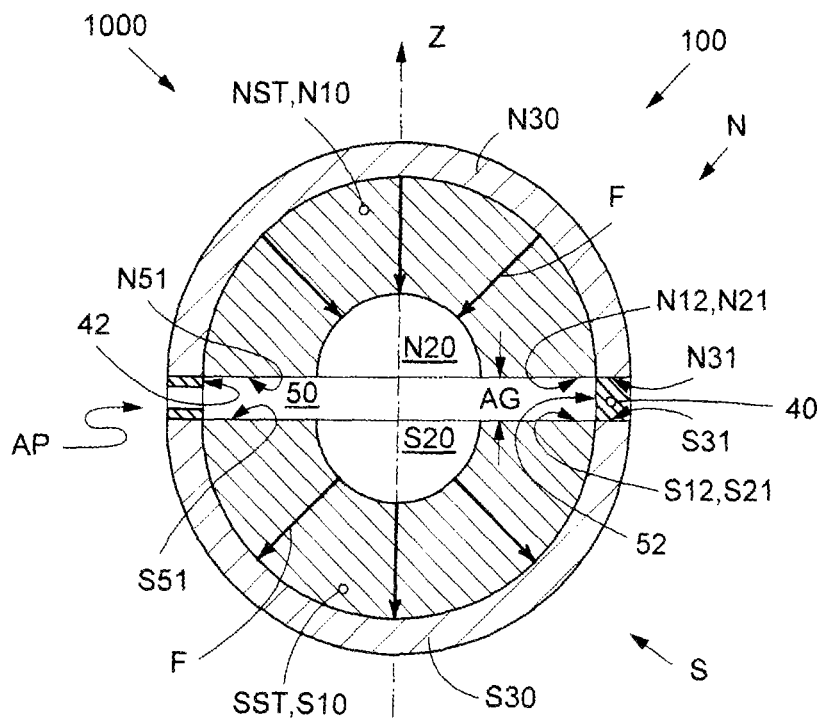
FIG. 1A is a representation of an ideal magnetic enclosure 100.
Figure 1B:
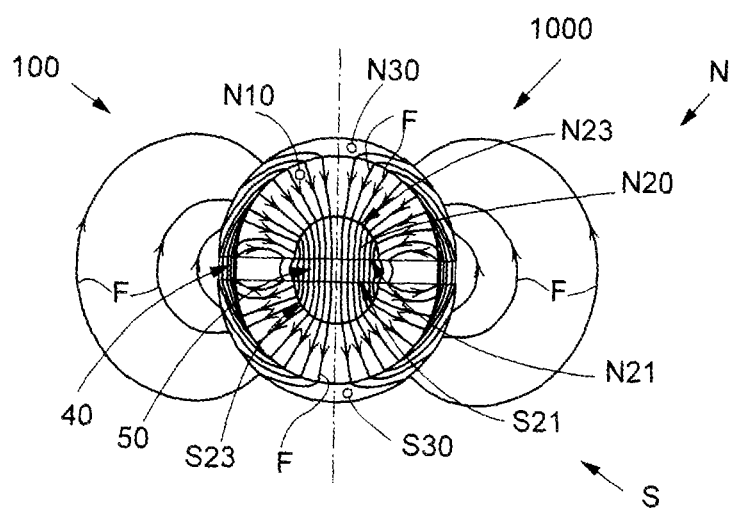
FIG. 1B shows the flow of lines of magnetic flux F in the ideal model 100.
Figure 2A:
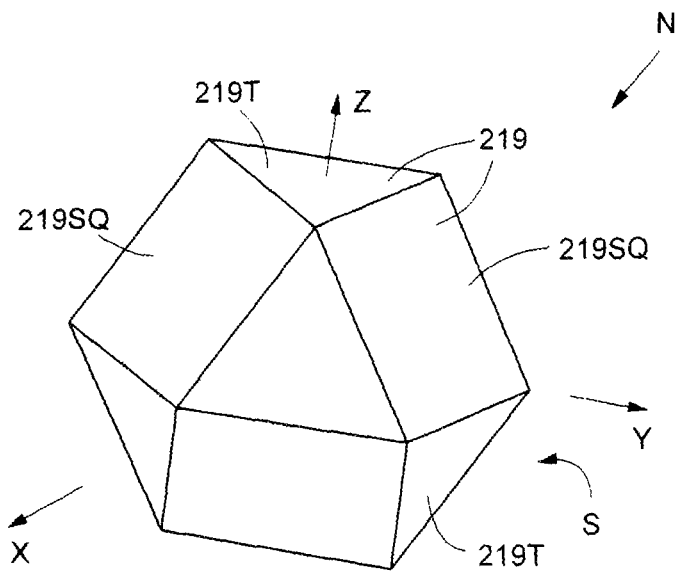
FIG. 2A depicts an isometric view of a cuboctahedron.

FIG. 2A depicts an isometric view of a cuboctahedron as an example of an approximation of a sphere. The cuboctahedron is one of the Archimedean solids, which cuboctahedron is formed by cutting-off the corners of a cube. A cuboctahedron has eighteen faces 219, or six equal square faces 219SQ and eight equal triangular faces 219T. The axis Z is a common axis passing for example through two identical and parallel triangular faces 219T. The cuboctahedron may be cut perpendicular to the axis Z, to form two identical portions, one north portion N, and one south portion S, both portions being identical but in need of relative rotation to become disposed in geometric mirroring symmetry.

Evidently, polyhedral shells may be obtained from hollow Archimedean solids. One polyhedral shell may have to be duplicated and may have to be rotated relative to the other shell for use as two identical shells that may be disposed in geometric mirroring symmetry relative to each other. Hollow Catalan solids may be treated in the same manner as the hollow Platonic and the hollow Archimedean solids to achieve two identical shells for disposition in geometric mirroring symmetry relative to each other.

Figure 2B:
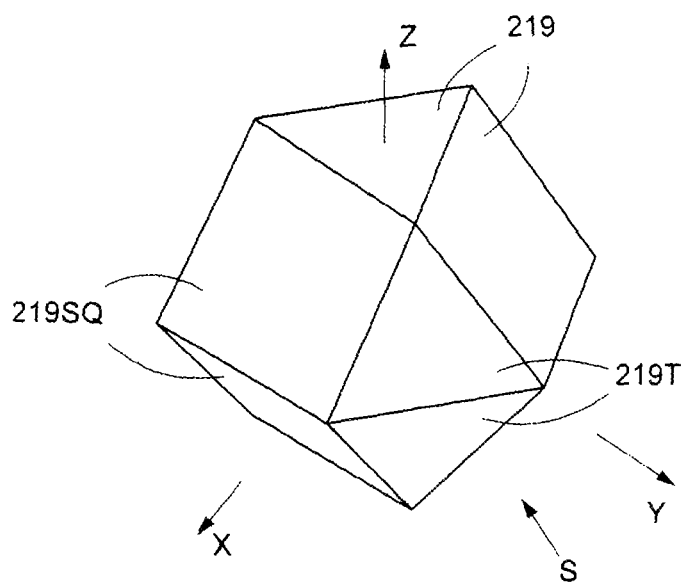
FIG. 2B depicts an isometric view of a symmetric cuboctahedron.

FIG. 2B is an isometric view of a symmetric cuboctahedron in alignment with a common vertical axis Z of a Cartesian set of coordinates. A symmetric cuboctahedron may be obtained by a cut through the cuboctahedron shown in FIG. 2A perpendicular to the Z-axis to separate the north portion N from the south portion S. The cut is followed by a rotation through 60° of the north portion N relative to the south portion S, such that the four square faces 219SQ on the north portion N contact the four square faces in the south portion S. The symmetric cuboctahedron has a north portion N and a south portion S that are identical and are disposed in geometric mirroring symmetry relative to each other.

For the sake of ease of description, a symmetric hollow cuboctahedron is referred to in the description of most of the embodiments and in some drawings presented hereinbelow, even though for example, any Platonic, Archimedean, or Catalan hollow solid may be used in practice. It is much simpler to describe a hollow symmetric cuboctahedron having fourteen polygonal faces, instead of, for example, a hollow snub dodecahedron with 80 triangles and 12 pentagons, thus with 92 faces in total. Evidently, a shell from a hollow snub dodecahedron provides a closer approximation of a hollow hemisphere than a hollow symmetric cuboctahedron, but even a shell of a cube offers a good and practical solution as a permanent magnet hemi-polyhedral shell.

Figure 3:
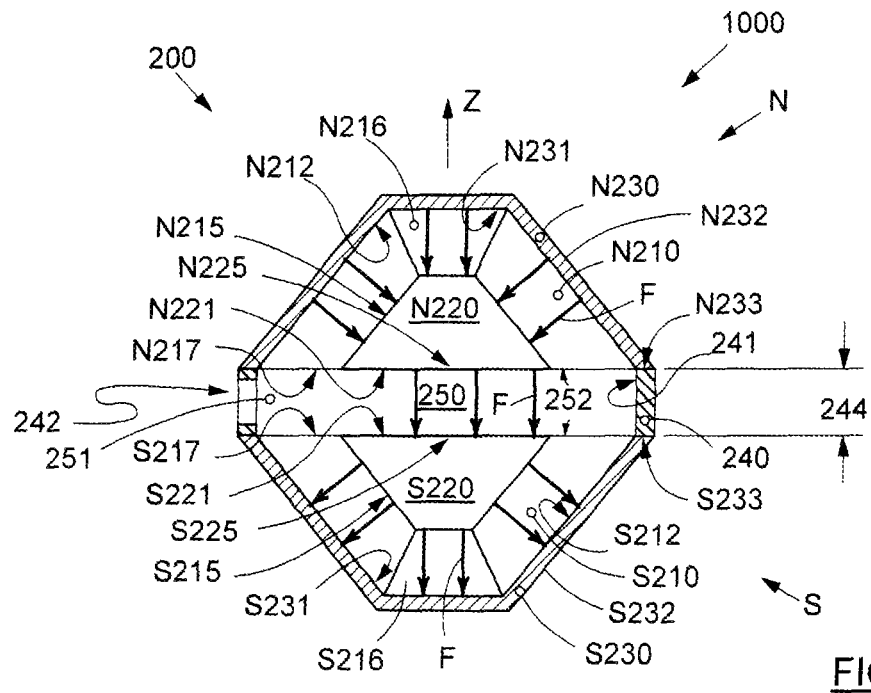
FIG. 3 illustrates an example of an embodiment 200.

FIG. 3 illustrates an embodiment of a magnetic enclosure 200 including two shells of a cuboctahedron as an example used for the sake of ease of visualization and description. Numerals without the prefix N or S refer to the same items disposed on the north portion N and on the south portion S.

FIG. 3 depicts a cross-section cut along the y-z plane of the symmetric cuboctahedron shown in FIG. 2B, with the cut passing through the hemi-polyhedral shell shield 230, the permanent magnet hemi-polyhedral shell 210, and the ring 240, but not through the pole piece 220, where the north portion N and the south portion S are aligned in geometric mirroring symmetry along the common axis Z. The north portion N and the south portion S are disposed in geometric mirroring symmetry opposite to each other and mutually separated apart by an air gap 251 forming the test chamber 250.

In the magnetic enclosure 200 of FIG. 3, the respective pole pieces 220 are covered by and disposed in abutting contact with their respective permanent magnet hemi-polyhedral shells 210, which in turn are covered by and disposed in abutting contact with their respective hemi-polyhedral shell shields 230. The hemi-polyhedral shell shields 230, the pole pieces 220, and the ring 240 are made of ferromagnetic material, while the permanent magnet hemi-polyhedral shells are made out of permanent magnetic material.

In FIG. 3, the ring 240 is disposed intermediate and in abutting contact with both the north shield rim N233 and the south shield rim S233. At least one radial aperture 242 is opened in the ring 240 to provide access to the test chamber 250. If desired, the at least one radial aperture 242 may be configured as a missing portion of the ring 240, which ring may be made of ferromagnetic material and may be manufactured as one or more pieces of material. The height 244 of the ring 240 is selected according to the desired volume of interest of the test chamber 250, versus the intensity of the magnetic field. The volume of interest or field of view is the volume within the test chamber 250 having a homogenous magnetic field appropriate for use with applications. Such applications may include among others, imaging spectroscopy, MRI and NMR.

The test chamber 250 is delimited in height by the pole base surfaces 221, by the magnet rims 217, by the shield rims 233, and laterally, by the interior surface 241 of the ring 240. It is noted that the pole base surface 221, the magnet rims 217, and the shield rims 233 may, but do not necessarily form a planar surface.

Arrows marked as F in FIG. 3 on the permanent magnet hemi-polyhedral shells N210, indicate the orientation of magnetization. In the north permanent magnet hemi-polyhedral shell N210, the lines of orientation of magnetization converge toward the center 225 of the north pole piece base surface N221, while in the south permanent magnet hemi-polyhedral shell S210, the orientation of magnetization may be considered to diverge out and away from the center 225 of the south pole piece base surface S221.

Figure 4:
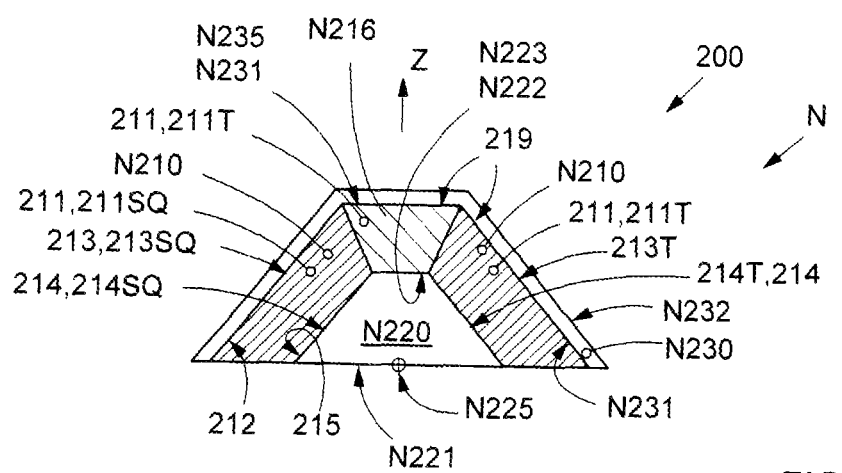
FIG. 4 is a cross-section of a detail of the north portion N shown in FIG. 3.

FIG. 4 is a cross-section of a detail of the north portion N shown in FIG. 3. The north permanent magnet hemi-polyhedral shell N210 is configured as a hemi-polyhedral shell, and represents half of a hollow cuboctahedron assembled out of seven pyramidal frusta 211, whereof three pyramidal frusta 211 are seen in FIG. 4. The cross-section of the exemplary magnetic enclosure 200 shown in FIG. 4 is selected as a cut through two triangular pyramidal frusta 211T, each one having a triangular base 213T and a triangular top 214T, and through one square pyramidal frustum 211SQ having a square base 213SQ and a square top 214SQ.

In the present example, each pyramidal frustum 211 may be selected as a normal or regular pyramidal frustum having a polygonal base 213 that forms a face 219, or a portion of a face, of the convex magnet exterior surface 212 of the permanent magnet hemi-polyhedral shell 210. Likewise, each pyramidal frustum 211 has a polygonal top 214, smaller in surface than the polygonal base 213, which polygonal top 214 forms a face, or a portion of a face, of the concave magnet interior surface 215. It is noted that in embodiments, the pyramidal frusta are not limited to a specific base 213 and a specific top 214, but may be selected to have a base and a top of desired polygonal shape. Furthermore, in embodiments, the polygonal pyramidal frusta may be oblique.

The height of each frustum 211 is the perpendicular distance separating apart the planes of the polygonal base 213 from the polygonal top 214. The height of each frustum may thus be the thickness of the permanent magnet hemi-polyhedral shell 210. The geometric axis of each normal pyramidal frustum 211 is that of the original pyramid, which geometric axis is also the axis of magnetization. In the present embodiment, the axes of magnetization of the pyramidal frusta 211 are oriented toward the center 225 of the pole piece base surface 221.

Figure 5:
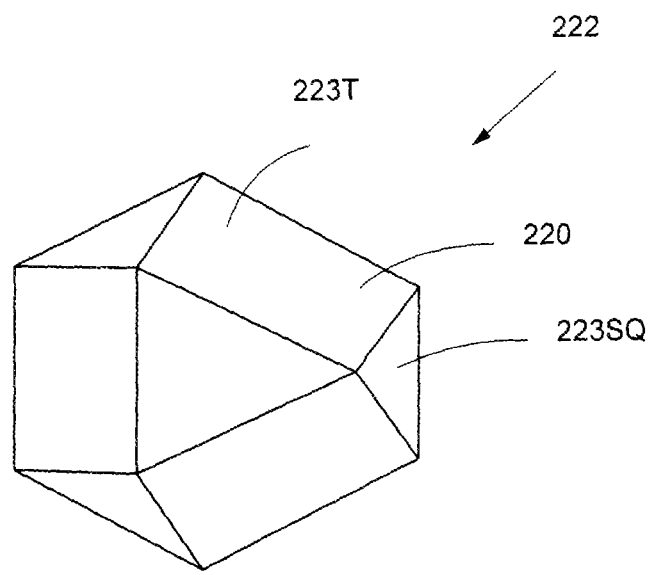
FIG. 5 is a top elevation of the solid hemi-cuboctahedron forming the hemi-polyhedral yoke 220.

FIG. 5 illustrates an exemplary top elevation showing the convex surface 222 of a symmetric hemi-cuboctahedron forming the solid hemi-polyhedral pole piece 220, shown in FIGS. 3 and 4. If desired, the hemi-polyhedral yoke 220, or pole piece 220, may be manufactures as a solid unitary piece of iron, or as an assembly of separate pieces of ferromagnetic material.

As shown in FIG. 4, the convex portion 222 of the pole piece 220 may be configured to have the same size and dimensions as, and to be conformal with, and covered in abutment by the concave magnet interior surface 215 of the permanent magnet hemi-polyhedral shell 210. In other words, the hemi-polyhedral pole piece 220 may be covered in abutting contact by the concave surface 215 of the permanent magnet hemi-polyhedral shell 210. If desired, the permanent magnet hemi-polyhedral shell 210 may cover the hemi-polyhedral pole piece 220 partially, completely, and in excess, thus even farther than, beyond and away from the pole piece base surface 221, so as to protrude into the tests chamber 250.

Still in FIG. 4, each convex portion polygonal surface 223 of the hemi-polyhedral pole piece 220 may be covered in abutting contact by a polygonal top 214 of the concave magnet interior surface 215 of the permanent magnet hemi-polyhedral shell 210. However, one or more convex portion polygonal surfaces 223 of the hemi-polyhedral pole piece 220 may be disposed in abutting contact with more than one polygonal top 214, or contact a polygonal top partially, or not abut at least one of the polygonal tops.

In the exemplary embodiment shown in FIG. 4, the hemi-polyhedral shell shield 230 covers and matches the convex magnet exterior surface 212 of the permanent magnet hemi-polyhedral shell 210 entirely and in conformal abutting contact. However, the concave shield interior surface 231 may match and cover the convex magnet exterior surface 212 partially if not completely, and may reach even farther, thus beyond and away from the magnet rim 217.

Figure 8:
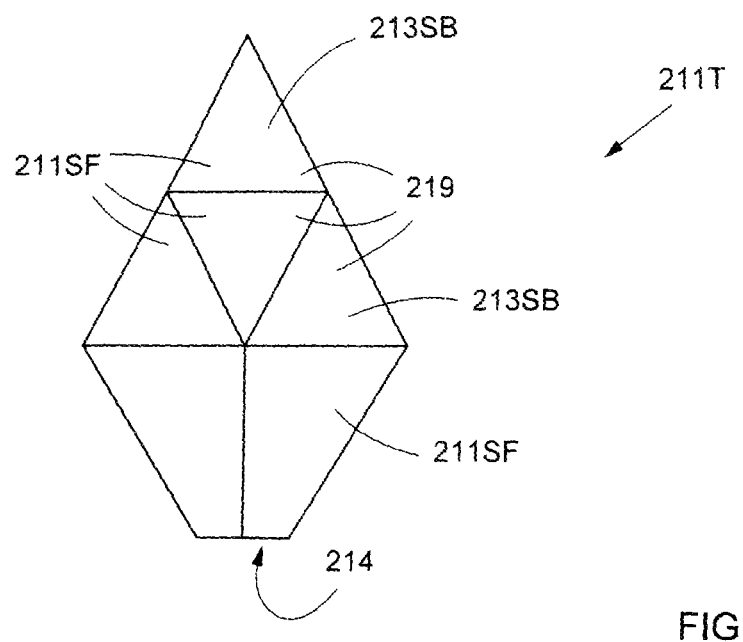
FIG. 8 is an example of tessellation of a frustum base.

A polygon 235 of the concave shield interior surface 231 may cover none, one, or a plurality of bases 213 of a frustum 211 of the permanent magnet hemi-polyhedral shell 210, or cover such a base partially. For example, a polygon 235 of the concave shield interior surface 231 may cover a plurality of bases 213 when a pyramidal frustum 211 is assembled out of a plurality of sub-frusta 211SF. This means that a base 213 may be tessellated by sub-bases 213SB of sub-frusta 211SF where the base of each sub-frustum is a polygonal base or a base of any desired convex shape, as described hereinbelow and as shown in FIG. 8 for example.

In FIG. 4, the convex shield exterior surface 232 is shown conformal to the concave shield interior surface 231, but this is not necessarily so. The shape of the convex shield exterior surface 232 may be selected as a spherical surface or as any other desired practical shape.

In an embodiment, and according to the description hereinabove, each one of the north portion N and of the south portion S may thus have a permanent magnet shell or a permanent magnet assembly 216 of cap-like shape having magnetization directions and having a convex magnet exterior surface 212 joining a concave magnet interior surface 215 at a magnet rim 217. The ferromagnetic pole piece 220 may have a pole piece convex surface 222 that is disposed in abutting contact with the concave magnet interior surface 215, where the pole piece convex surface joins a pole piece base surface 221 adjacent the magnet rim 217. The ferromagnetic cap-like shield 230 may have a convex shield exterior surface 232 that joins the concave shield interior surface 231 at the shield rim 233, where the concave shield interior surface may be disposed in abutting contact with the convex magnet exterior surface 212, and where the shield rim 233 may be adjacent the magnet rim 217. The ferromagnetic ring 240 may have a ring height 244 bridging the air gap 251, shown in FIG. 3, and may be disposed in abutting contact with and intermediate between the shield rim N217 of the north portion N and the shield rim S217 of the south portion S, where the ring has at least one aperture 242 that is entered therein for allowing access to the test chamber 250.

The north portion N comprises the north shield N230 having a north convex shield exterior surface N232 joining a north concave shield interior surface N231 at the north shield rim N233. The north portion N further comprises the north permanent magnet assembly N216 where the north convex magnet exterior surface N212 joins the north concave magnet interior surface N215 at the north magnet rim N217. The ferromagnetic north pole piece N220 has a north pole piece convex surface N222 that joins the north pole piece base surface N221. Likewise and in parallel, the south portion comprises the ferromagnetic south pole piece S220 having a south pole piece base surface S221 that joins the south pole piece convex surface S222, and includes the south permanent magnet assembly S216 having a south concave magnet interior surface S215 joining the south convex magnet exterior surface S212 at the south magnet rim S217. Furthermore, the south shield S230 may have a south concave shield interior surface S231 joining the south convex shield exterior surface S232 at the south shield rim S233.

The north permanent magnet assembly N216 has magnetization orientations in directions converging toward the north pole piece 220, for lines of magnetic flux F, shown in FIG. 3, to radially-like enter the north pole piece convex surface N222 and to exit perpendicular to and in parallel out of the north pole piece base surface N221 into the test chamber 250. "Radial-like", or "radially-like" are terms used for embodiments where the permanent magnets 210 are not shaped as two ideal hollow hemisphere 10. Rather, the permanent magnets 210 approximate a hollow hemisphere 10 to a certain degree, by being shaped as a cap-like shell of a hollow multi-faced polyhedron. Before the permanent magnet hollow polyhedron is cut into two identical portions to form the two permanent magnet hemi-polyhedral shells, the directions of orientation of magnetization point toward or away from the center of the polyhedron: toward for the north portion N and away for the south portion S. After the permanent magnet hollow polyhedron is cut into two identical portions and is separated by the ring 240, the directions of orientation of magnetization remain the same as before cut-off. Hence, the wording "radial-like", or "radially-like", or "center oriented", or "centrally oriented" is used hereinbelow to indicate the actual direction of magnetization. For an ideal magnetic structure ST, the directions of magnetization would point toward the center of the equatorial planar surface 21 of the hemispherical pole pieces 20.

Lines of flux F are not shown on the pole pieces 222 for the sake of clarity. The lines of magnetic flux F enter and exit the test chamber 250 substantially in parallel and enter the south pole piece base surface S221 to exit radially-like out of the south pole piece convex surface S222 into the south permanent magnet assembly S216. The south permanent magnet assembly S216 has magnetization orientations in direction converging radially-like outward toward the south shield S230. Lines of flux F are not shown on the shield 230 and on the ring 240 for the sake of clarity. The lines of magnetic flux F exit out of the south permanent magnet assembly to the south concave shield interior surface S231, wherefrom the lines of magnetic flux F continue through the ring 240 and therefrom to the north shield N230, and from the north concave shield interior surface N231 to the north permanent magnet assembly N216 to form a closed magnetic flux circuit between the south portion S and the north portion N, and to form a homogeneous, stable, and uniform magnetic field in the test chamber 250. Evidently, the permanent magnet assembly 216 may be configured as a hollow hemi-polyhedron and may have polygonal faces on the convex magnet exterior surface 212 and on the concave magnet interior surface 215.

Additional Embodiments

Some examples of the multiple possible variations of the embodiment 200 still within the scope of the present disclosure are described hereinbelow.

Figure 6A:
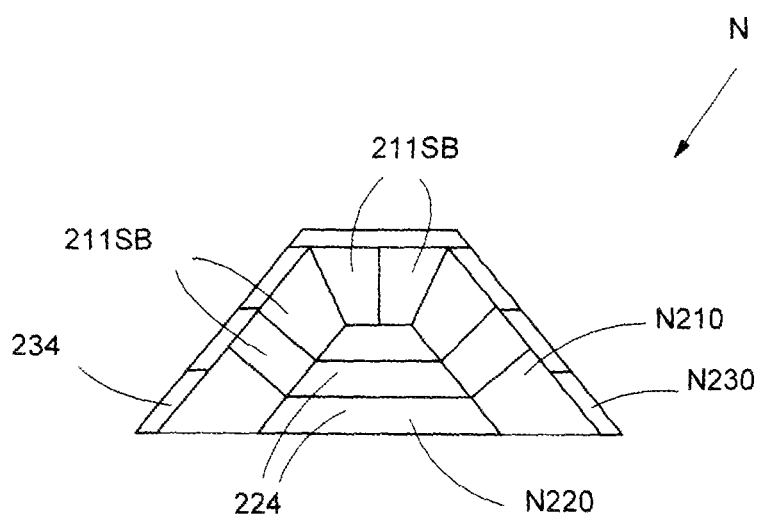
FIGS. 6A to 6D present further exemplary embodiments.

FIG. 6A is a schematic partial cross-section of an example of a north portion N of an embodiment where the pole piece 220 and the hemi-polyhedral shell shield 230 are made out of, respectively, circular pole piece portions 224, and circular shield portions 234. If desired, the pole piece 220 and the shell shield 230 may be built as an assembly of pieces of material having various and different shapes, and not necessarily having the shapes shown in FIG. 6A. FIG. 6A also depicts frusta 211 assembled out of a plurality of sub-frusta 211SF having a polygonal base or other base shape useful for the purpose.

Figure 6B:
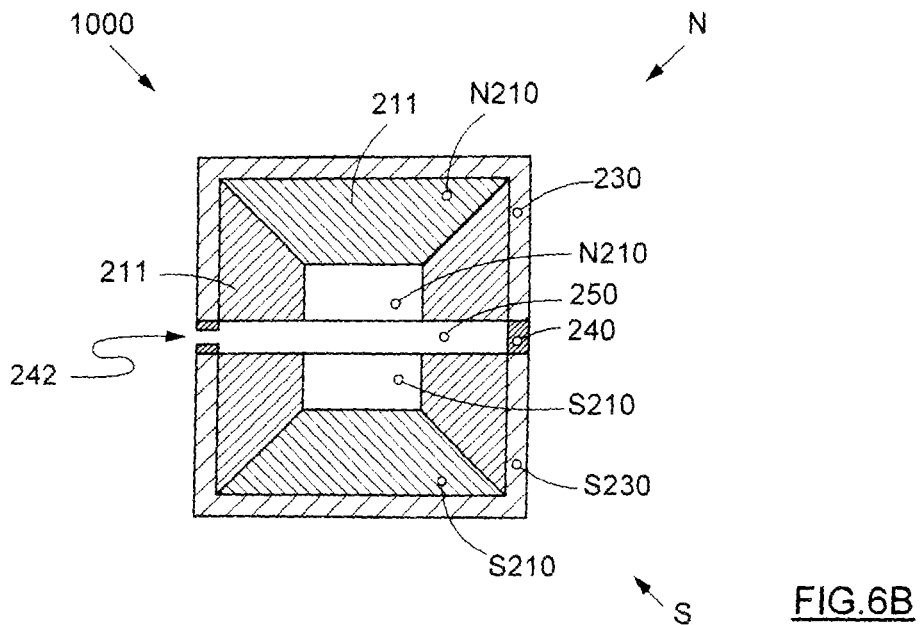

FIG. 6B illustrates a schematic partial cross-section of an example of an embodiment where the permanent magnet hemi-polyhedral shell 210 is selected as a shell of a cube. The hemi-polyhedral shield shell 230 is configured as a hollow half-cube and the pole piece 220 is built as a solid half-cube. The shield shell 230 and the pole piece 220, together with the ring 240, are made of ferromagnetic material, and may be assembled out of a plurality of building pieces in one or more pieces. The permanent magnet hemi-polyhedral shell 210 is also configured as a conforming hollow half-cube, where each one of the five faces of the hollow cube is configured as a pyramidal frustum 211, whereof three faces are seen in FIG. 6B, and where each frustum may be built out of one or more pieces. The permanent magnet hemi-polyhedral shell 210 covers and abuts in contact with the pole piece 220, and the hemi-polyhedral shield shell 230 covers and abuts in contact with the permanent magnet hemi-polyhedral shell. The north portion N and the south portion S are coupled together by the ring 240 having at least one aperture 242 leading to the test chamber 250. The magnetic enclosure 1000 shown in FIG. 6B is completely filled with solid material, as are the other embodiments described herewith. However, if desired, air-filled volumes may be introduced, in the configuration of the magnetic enclosure 1000.

Figure 6C:
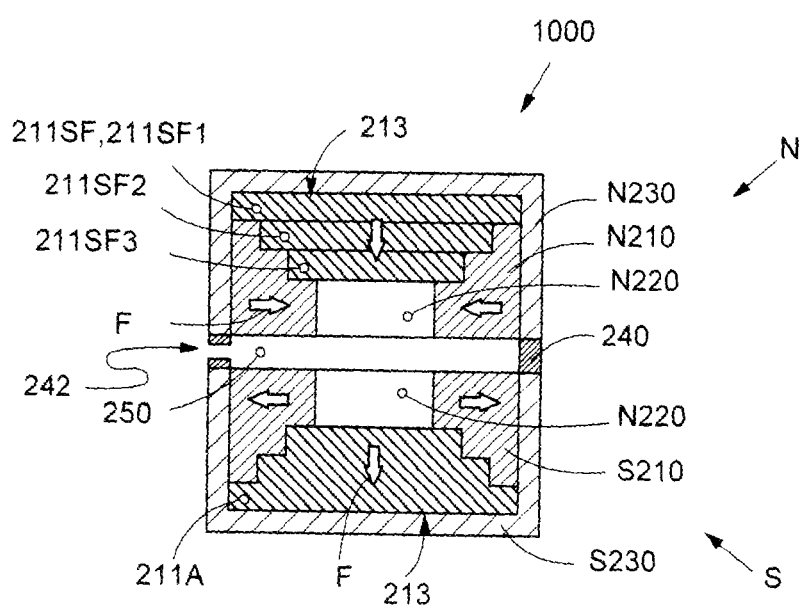

FIG. 6C is another embodiment, as a version of the magnetic enclosure 1000 shown in FIG. 6B, where the permanent magnet hemi-polyhedral shell 210 is configured as a shell of a cube. FIG. 6C is used to exemplify the flexibility of implementation of the approximation of the ideal model 100 as a permanent magnet hemi-polyhedral shell 210 configuration with a radially-like oriented or centrally oriented direction of magnetization.

Like the other embodiments described herewith, the permanent magnet hemi-polyhedral shell 210 preferably covers and abuts in contact with the pole piece 220, and the hemi-polyhedral shield shell 230 preferably covers and abuts in contact with the permanent magnet hemi-polyhedral shell. The north portion N and the south portion S are coupled together by the ring 240 having at least one aperture 242 leading into the test chamber 250.

In FIG. 6C, the frusta of the permanent magnetic shell 210 are configured as an approximation selected as an Aztec pyramid 211A in replacement of the regular pyramidal frusta 211 shown in FIG. 6B for example. Such a frustum 211A is shown in the south portion S as one solid piece of material, whereas the geometric mirroring image thereof is shown in the north portion N as being made out of, for example, three sub-frusta 211SF, marked respectively as 211SF1, 211FB2, and 211SF3. Therefore, since the south frustum 211A and the three north sub-frusta 211SF are made out of a different number of building pieces, the south frustum 211A is referred to as being "substantially" identical to the sub-frusta 211SF, in contrast with being exactly identical thereto.

Like the other embodiments described herewith, the permanent magnet hemi-polyhedral shell 210 preferably covers and abuts in contact with the pole piece 220, and the hemi-polyhedral shield shell 230 preferably covers and abuts in contact with the permanent magnet hemi-polyhedral shell. The north portion N and the south portion S are coupled together by the ring 240 having an aperture 242 leading into the test chamber 250. Attention is drawn to the fact that the number of polygonal bases 213 of the permanent magnet hemi-polyhedral shell 210, in the embodiment shown in FIG. 6C, remains unchanged when compared to the embodiment depicted in FIG. 6B. However, if desired, the pyramidal frustum 211SF may be further subdivided and be assembled out of a plurality of more pyramidal sub-frusta 211SF, and the same is true for the sub-frusta 211SB1 to 211SB3 that may still be divided into more additional pieces if found useful.

Hence, the embodiments of the present disclosure allow to approximate the ideal hollow hemispherical permanent magnet 210 as a hollow hemi-polyhedron, and the hollow hemi-polyhedron itself may also be approximated, be it in shape or in the number of pieces wherefrom it is built.

Figure 6D:
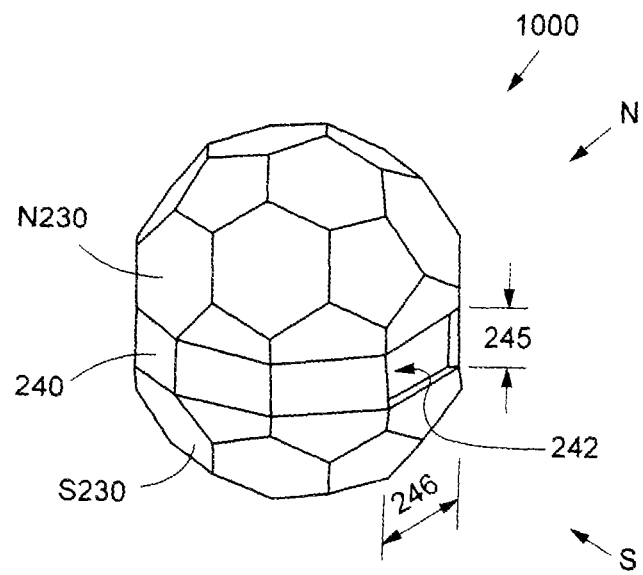

FIG. 6D is an isometric view of an exemplary embodiment of a magnetic enclosure 1000 having a north portion N and a south portion S configured as a hemi-truncated icosahedron. A truncated icosahedron, or "soccer-ball", has 32 faces, including 12 triangular faces and 20 hexagonal faces. The permanent magnet hemi-polyhedral shells N210 and S210 of the present embodiment, but not shown in FIG. 6D, are conformal to the hemi-polyhedral shell shields N230 and S230. The ring 240 separates between the north portion N and the south portion S, and has an aperture 242 leading into the test chamber 250.

As described hereinabove with respect to FIG. 4, the permanent magnet assembly 216 may include a plurality of right pyramidal frusta 211, each one having a polygonal base 213SQ, with or without a flat surface that may be disposed in abutting contact with the concave shield interior surface 231. Furthermore, the polygonal top 214T, with or without a flat surface, may be disposed in abutting contact with the pole piece convex surface.

The concave shield interior surface 231 of the ferromagnetic cap-like shield 230 may be configured to cover the convex magnetic exterior surface 212 in abutting contact coverage selected from a group consisting of partial coverage, complete coverage extending flush with the magnet rim, and complete coverage extending beyond the magnet rim. The concave magnet interior surface 215 of the permanent magnet assembly 210 may be configured to cover the pole piece convex surface 222 in abutting contact coverage in partial coverage, in complete coverage extending flush with the pole piece base surface 221, and in complete coverage extending beyond the pole piece base surface.

If desired, the pole piece 220 may be configured to have a pole piece base surface 221 selected alone and in combination to include a flat planar surface, a concave surface, and a convex surface. Moreover, the north portion N and the south portion S may be aligned in mutual geometric mirroring symmetric disposition along a common axis Z, which axis crosses a face 219 on the north permanent magnet assembly N216 that is identical to a face on the south permanent magnet assembly S216. The ring 240 may be disposed intermediate between the north portion N and the south portion S in concentricity with the common axis Z, and the at least one aperture 242 disposed in the ring leads into the test chamber 250. The ferromagnetic hemi-polyhedral north pole piece N230 and the hemi-polyhedral ferromagnetic south pole piece S230 may each one be configured to operate as a magnetic lens. This means that lines of magnetic flux F received in radial-like distribution on the north pole piece convex surface N222 are realigned to converge and to exit out of the north pole piece base surface N221 in substantial parallel alignment distribution, and that lines of magnetic flux received in substantial parallel alignment distribution on the south pole piece base surface S221 are realigned to diverge and exit out of the south pole piece convex surface 222 in radial-like divergent distribution.

Each one pyramidal frustum 211 has a frustum height, which is a geometrical axis and an axis of magnetization that is co-aligned with the geometrical axis, and the axis of magnetization of the frusta of the permanent magnet assembly 216 may be oriented radially-like toward the center 225 of the pole piece base surface 221.

Figure 11:
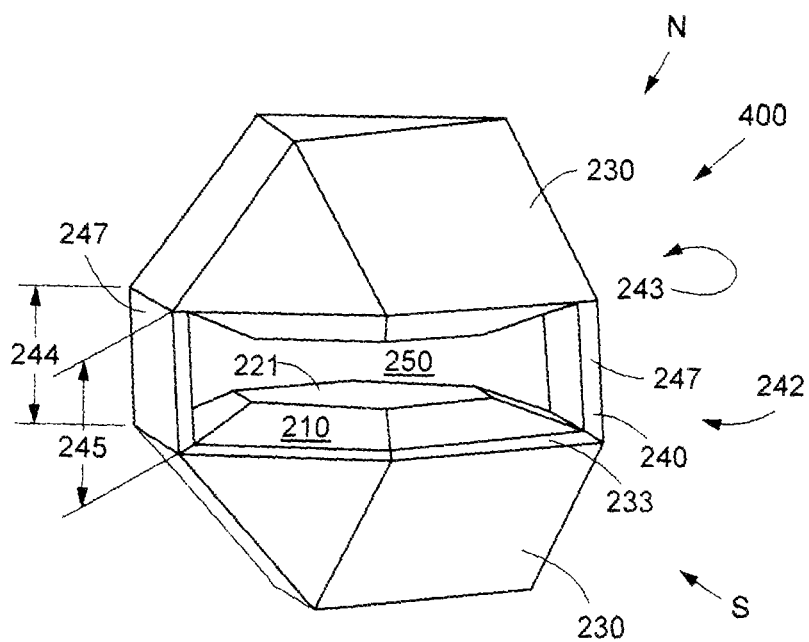
FIG. 11 is an isometric representation of an embodiment having two apertures.

Regarding the ring 240, the at least one first aperture 242 may be configured to allow introduction of at least one portion of a test object into the test chamber 250, while at least one second aperture 243, shown in FIG. 11, may be opened in the ring and may be configured to allow entry and exit into and out of the test chamber 250. The at least one second aperture 243 may be disposed relative to the at least one first aperture 242 in linear continuation thereof and in angular disposition thereto. Finally, the magnetic enclosure may have an interior volume that is enclosed by the magnetic enclosure, and the test chamber, which is delimited by walls 252, planar or not, and by the interior surface of the ring 241 may possibly be the sole a void portion of the magnetic enclosure.

Furthermore, combinations of the embodiments described hereinabove may also be useful.

Building a Magnetic Enclosure

Building a magnetic enclosure 200 may start with the fabrication of the various elements thereof, including the permanent magnet hemi-polyhedral shells 210, the pole pieces 220, the shields 230, and the ring 240. Thereafter, these elements are assembled. Assembly is achieved by use of glue for example, or by means known to those skilled in the art.

A permanent magnet 210, also referred to as a permanent magnet structure 210, shaped as a shell of a hemi-cuboctahedron for example, may be built out of an assembly of right, or normal pyramidal frusta 211, where each frustum ends as a polygonal bottom base 213 on the convex magnet exterior surface 212. Likewise, each frustum 211 has a polygonal top 214, smaller in surface than the polygonal base 213, were the polygonal top ends as a face abutting in contact with the concave magnet interior surface 215 of the polyhedral shell 210.

A hollow hemi-polyhedron, such as for example a hollow hemi-cuboctahedron, may thus be produced by assembly of at least seven pyramidal frusta 211, which frusta are fixedly attached to each other to form one solid permanent magnet hemi-polyhedral shell 210 having a radial-like or central direction of magnetization. Fixed mutual attachment of the frusta 211 may be achieved for example, by use of glue, of double-sided tape, or of a three-dimensional honeycomb-like structure 260, or lattice 260, shown in FIG. 7, where the lattice is configured to receive the frusta 211 therein. Assembly of the pyramidal frusta 211 may also be achieved by other means known to those skilled in the art.

Figure 7:
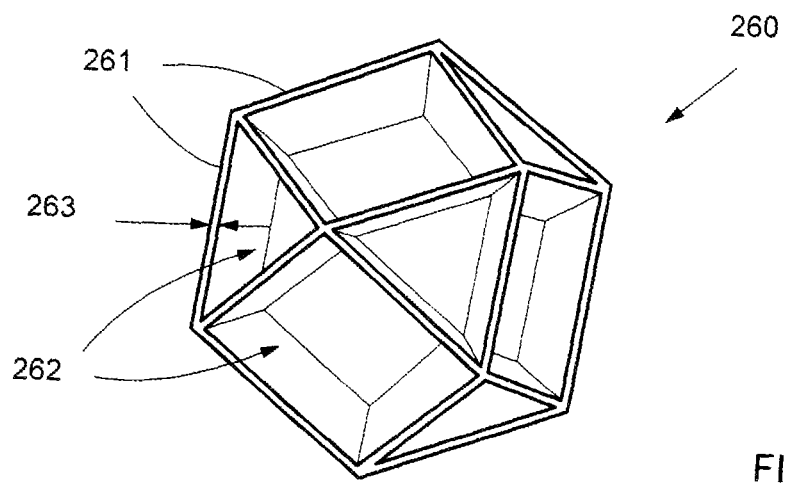
FIG. 7 illustrates a honeycomb-like assembly structure.

FIG. 7 illustrates a substantially hemi-polyhedral-shaped honeycomb-like structure 260 that may be provided for ease of assembly of the frusta 211 forming the exemplary embodiment of the permanent magnet hemi-polyhedral shell 210 of a cuboctahedron. The honeycomb-like structure 260 has a plurality of open cells 261 configured to receive a frustum 211 therein through a cell opening 262. A thin wall 263 of negligible thickness separates between adjacent cells 261. The magnetized pyramidal frusta 211 are introduced for fixed retention into matching openings of the cells 261. The structure 260 is thus a three-dimensional grid configured to accept pyramidal frusta 211 into open cells 261 disposed therein, to facilitate assembly.

The use of a lattice 260, or of double-sided tape, or even of glue to form a permanent magnet assembly 216 evidently leaves interstices between the assembled frusta 211. Thereby, the convex magnet exterior surface 212 and the concave magnet interior surface 215 are not perfectly continuous surfaces. Such interstices are considered to be of negligible thickness relative to the dimensions of the frusta since the intensity of the magnetic field is practically unaffected. Therefore, the wording "practically continuous" indicates the presence of such interstices of negligible thickness on both the convex magnet exterior surface 212 and the concave magnet interior surface 215.

A polygonal face 219 of the permanent magnet hemi-polyhedral shell 210 may be built as one single polygonal frustum 211, or as an assembly of a plurality of sub-frusta 211SF. Furthermore, each polygonal frustum 211 or sub-frustum 211SF may be different in shape from a neighboring frustum, and may be normal or oblique if beneficial. However, the principles of assembly of a permanent magnet hemi-polyhedral shell 210 remain the same. To further facilitate assembly, the honeycomb-like structure 260 may be configured, or be sub-divided, into the same number of cells 261 as the number of sub-frusta 211SF.

FIG. 8 depicts a triangular pyramidal frustum 211T subdivided for example into four sub-frusta 211SF showing four triangular polygonal faces 219T of a magnet hemi-polyhedral shell 210. Since a frustum 211 may be divided into sub-frusta 211SF, the face 219 may be assembled out of a plurality of sub-bases 213SB pertaining to sub-frusta 211SF. The face 219 shown in FIG. 8 features a tessellation of four sub-bases 213SB of triangular shape, where the thickness of the walls 263 of the structure 260 is omitted for the sake of simplicity. If desired, the honeycomb-like structure 260 may be configured to accept any practical type of tessellation of the bases 213, with bases having different polygonal shapes. Although not shown in the Figs., a base 213 may be selected not only as a polygon but also as a circle, as an ellipse, or as any desired convex shapes. The honeycomb-like structure 260 may be configured appropriately to accommodate the desired tessellation.

The pyramidal frusta 211 of magnetic material may be produced first. Such production includes shaping of the frusta 211, like sintering, machining, grinding, as well as magnetization along the desired axes, according to steps and processes well known to those skilled in the art. Thereafter, the pyramidal frusta 211 may be assembled into a permanent magnet hemi-polyhedral shell 210. As described hereinabove, the assembly may include for example, gluing, use of double-sided tape, or insertion into a honeycomb-like structure 260. The assembly procedure may be repeated to obtain two identical permanent magnet hemi-polyhedral magnetic shells 210, one for the north portion N and one for the south portion S, but with the magnetic shell 210 for the north portion N and the magnetic shell 210 for the south portion S having an appropriately radially-like or centrally oriented direction of magnetization.

In turn, the pole piece 220 may be produced as one solid entity or be assembled out of various pieces of material. The pole piece 220 may be machined, or cast, or otherwise produced as known to those skilled in the art, such that when covered by the permanent magnet hemi-polyhedral shell 210, the polygonal tops 214 of the pyramidal frusta 211 will abut in contact with the convex portion polygonal surfaces 223 of the convex surface 222. The operation is repeated to obtain both a north pole piece N220 and a south pole piece S220.

Thereafter, the north hemi-polyhedral magnetic shell N210 is disposed to cover the solid pole piece N220, and the same is repeated for the south hemi-polyhedral magnetic shell S210 and the south pole piece S220.

Next, the shield 230 is fabricated, again by means known to those skilled in the art, out of one piece of material or as an assembly of a plurality of pieces. The shield 230 is manufactured such that the concave shield interior surface 231 are configured to allow abutting contact with the polygonal bases 213 of the pyramidal frusta 211 on the convex magnet exterior surface 212 when assembled thereon. The operation is repeated to obtain both a north shield N230 and a south shield S230. If desired, instead of being manufactured as one solid piece of material, the shield 230 may be built out of a plurality of geometrical bodies, such as frusta, rings, or polyhedra for example, which geometrical bodies may be assembled together, for example, buy use of glue.

Finally, the ring 240 may be manufactured out of ferromagnetic material, once more by means known to those skilled in the art, out of one piece of material or as an assembly of a plurality of pieces. The ring 240 is configured to have an appropriately selected inner dimension such that contact will be made with the shield 230 when assembled in abutting contact therewith, without contacting the north and south permanent magnet hemi-polyhedral shells, respectively N210 and S210. At least one radial aperture 242 may be entered in the ring 240 to provide access to the test chamber 250.

The assembly into a magnetic enclosure proceeds as follows for example. The north permanent magnet hemi-polyhedral shell N210 is disposed on the north pole piece N220 and mutual abutting contact is ascertained. The same is repeated for the south permanent magnet hemi-polyhedral shell S210 and the south pole piece S220. Thereafter, the north shield N230 is disposed on the north permanent magnet hemi-polyhedral shell N210 and mutual abutting contact is ascertained. The same is repeated for the south permanent magnet hemi-polyhedral shell S210 and the shield S230.

To finish the assembly of the magnetic enclosure 200, the ring 240 is disposed intermediate between the north portion N and the south portion S, in concentric alignment and in abutting contact with both north and south pole shield rims, respectively N233 and S233, to confine the test chamber therebetween.

In practical situations, normal manufacturing tolerances both in dimensions as well as in magnetic properties of the permanent magnetic material frusta building blocks, which are the frusta 211, introduce minor magnetic field distortions and fluctuations in the homogeneity of the magnetic field in the test chamber 250. A known process called "tuning" or "shimming", using passive shims elements to adjust the positions of the magnetic members, and filters for field non-uniformities commonly compensates such magnetic field distortions and fluctuations. For example, shims may be added alone or in combination, to the pole piece base surface 221, to the magnet rim 217, to the shield rim 233, and to the interior surface 241 of the ring 240. Furthermore, an optional active shimming mechanism may be selected as one shimming coil or as an array of active shim coils.

Regarding shimming, it is known that the strength and uniformity of the magnetic field in the test chamber 250 may be adjusted by adding a set of auxiliary permanent magnets or a set of electromagnetic coils operative in association with the permanent magnet hemi-polyhedral shell 210. Further adjustment of the magnetic field may be accomplished by shaping of the pole pieces, thereby affecting the shape and direction of the resulting magnetic field.

The addition of shims, for example to the north portion N may cause that north portion to become not absolutely identical to the south portion S, which explains why the wording "substantially identical" was used hereinabove.

Enhanced Access into the Test Chamber

If desired, access into the test chamber 250 and visual inspection of the interior thereof may be facilitated. For example, with reference to FIG. 3, the height of the at least one aperture 242 opened in the ring 240 may be increased. Alternatively, the height of the air gap 251 may be augmented. Another option is to cut away a portion of the shield 230 and of the permanent magnet 210, as shown in FIG. 10.

Figure 10:
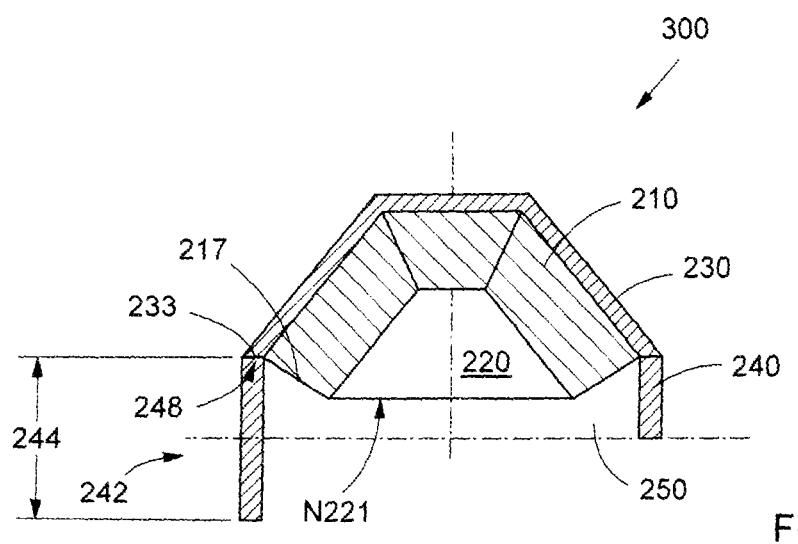
FIG. 10 depicts a large opening.

FIG. 10 illustrates a cross-section of the north portion N of an embodiment 300. The embodiment 300 is a variation of the embodiment 200 providing enhanced access into the test chamber 250. In the embodiment 300, the pole piece 220 remains intact, thus is the same as with the embodiment 200 shown in FIG. 3. However, in comparison with the embodiment 200, a portion of the shield 230 adjacent the rim 233 and a portion of the permanent magnet 210 near the rim 217 have been removed. The ring height 244 is increased and the magnet rim 217 is cut to slant from the ring rim 248 to the pole piece base surface 221. The distance separating between the two pole piece base surfaces, namely N221 and S221, not shown in FIG. 10, may remain unchanged relative to the embodiment 200. In cross-section, the aperture 242 has a funnel-like shape: wider open in the ring and converging into the pole piece base surface 221. It is noted that in FIG. 10 a portion of the ring 240 has been removed to further facilitate entrance into the test chamber 250. Even though one aperture 242 is shown in FIG. 10, more apertures may be provided, either as openings in the ring 240 and/or as portions removed from the ring. It is understood that the at least one aperture 242 providing access to the test chamber 250 may be entered in the ring 240 or may be formed by deletion of a portion of the ring. Opening a plurality of apertures 242 is achieved by either opening a plurality of apertures in the ring 240 and/or by deleting a plurality of portions of the ring.

To further enhance access into the test chamber 250, the width of the aperture 241 may be enlarged. FIG. 6D illustrates an embodiment showing one aperture 242 having an aperture height 245 and an aperture width 246. Even better access to the test chamber 250 is obtained when more apertures 241 are opened in the ring 240.

FIG. 11 is an isometric representation of an embodiment 400 having two apertures 242. The aperture height 245 is as high as the ring height 244, whereby the ring 240 may be regarded as having two missing portions. In other words, the ring is reduced to two ring portions 247. This means that the pole piece base surface 221 is disposed to protrude out of the shield 230 and away from the shield rim 233 to facilitate access to in between the two opposite pole piece base surfaces. Thus, recessing the shield rim 233 relative to the pole piece base surface 221 enhances access into the test chamber 250. The purpose is to enhance access to an interval separating apart the north pole piece base surface N221 from the south pole piece surface S221, as depicted in FIG. 10 for the embodiment 300.

It is possible to compare the performance of magnetic enclosures by comparing figures of merit. A figure of merit is defined as:

$$\text{Figure of Merit} = B_0^2 \cdot V$$

where

B0 is the magnetic field in the center of the volume of interest, and

V if the FOV (Field of View), which is defined here by the volume enclosed by $|B(xyz)-B_0| \leq 0.1$ gauss.

Figure 9:
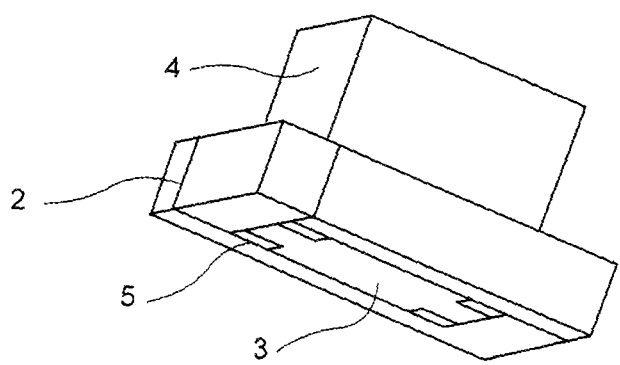
FIG. 9 shows the background art.

The intensity of the magnetic field is referred to as $B_0$. With the background art, for example for FIG. 9, which is shown as FIG. 3 in U.S. Pat. No. 7,400,147 by Rapoport, $B_0=1.14$ Teslas. In comparison thereto, the "soccer ball" embodiment shown in FIG. 6D features a magnetic field intensity of $B_0=1.52$ Teslas, which is an improvement of 33% over the background art.

In the description and claims of the present application, each one of the verbs, "comprise" "include" and "have", and conjugates thereof, are used to indicate that the subject or subjects of the verb are not necessarily a complete listing of members, components, elements or parts of the subject or subjects of the verb.

Although the present embodiments have been described to a certain degree of particularity, it should be understood that various alterations and modifications could be made without departing from the scope of the disclosure as hereinafter claimed.

For example, it is possible to provide a magnetic enclosure 200 having two permanent magnet structures providing a homogeneous, stable, and uniform magnetic field in a test chamber 250. The magnetic enclosure may comprise a north portion N substantially identical to a south portion S disposed in geometric mirroring symmetry opposite to each other and mutually separated apart by an air gap. Each one of the north portion and of the south portion may comprise a permanent magnet assembly 216 having practically a continuous convex magnet exterior surface 212 and a concave magnet interior surface 215 shaped as a shell of a polyhedron to approximate a hemisphere. Each one of the north portion and of the south portion may further comprise a ferromagnetic pole piece 220 configured as a magnetic lens, where the pole piece has a pole piece convex surface disposed in abutting contact with the concave magnet interior surface, and has a pole piece base surface, a ferromagnetic shield having a shield rim from which extend a convex shield exterior surface and a concave shield interior surface that is disposed in abutting contact with the convex magnet exterior surface, and a ferromagnetic ring 240 disposed in abutting contact with and intermediate between the shield rim of the north portion and of the south portion. The ring may be configured to form a return path between the two permanent magnet structures, and to provide access to the test chamber via at least one aperture 242 opened in the ring.

REFERENCE SIGNS LIST

AG air gap
AP opening or aperture
F lines of magnetic flux
N north portion N
ST NST/SST north/south magnetic structure
S south portion
Z common axis
10 N10/S10 north/south hollow hemisphere permanent magnet 10
12 N12/S12 north/south magnet rim
20 N20/S20 north/south hemispherical pole piece 20
21 N21/S21 north/south equatorial planar surface
23 N23/S23 convex portion of pole price
30 N30/S30 north/south hemispheric shield 30
31 N31/S31 north/south shield rim
40 belt
50 test chamber
51 N51/S51 north/south test chamber wall
52 interior surface of the belt
100 ideal model of a magnetic enclosure
200 embodiment of a magnetic enclosure
210 N210/S210 north/south permanent magnet hemi-polyhedral shell
211 211SQ/211T quadrilateral/triangular/polygonal pyramidal frustum
211SF sub-frusta
212 N212/S212 north/south convex magnet exterior surface of 210
213 213SQ/213T square/triangular/polygonal base
213SB sub-bases
214 214SQ/214T square/triangular polygonal top
215 N215/S215 north/south concave magnet interior surface of 210
216 N216/S216 north/south permanent magnet assembly
217 N217/S217 north/south magnet rim
219 219SQ/219T square/triangular/polygonal face of polyhedron
220 N220/S220 north/south pole piece or yoke
221 N221/S221 north/south pole piece base surface
222 N222/S222 north/south pole piece convex surface of the 220
223 223SQ/223T square/triangular/convex portion polygonal surface of 220
224 circular pole piece portion
225 center of the pole piece base surface
230 N230/S230 north/south shield
231 N231/S231 north/south concave shield interior surface
232 N232/S232 north/south convex shield exterior surface
233 N233/S233 north/south shield rim
234 circular shield portion
235 N223/S235 north/south polygon of concave shield interior surface
240 ring
241 interior surface of the ring
242 at least one aperture
243 second aperture
244 ring height
245 aperture height
246 aperture width
247 ring portion
248 ring rim
250 test chamber
251 air gap
252 N252/S252 north/south wall of test chamber
253 test chamber interior
260 honeycomb-like structure
261 cell opening
262 cell opening
263 thin wall
1000 magnetic enclosure

The invention claimed is:

1. A magnetic enclosure providing a homogeneous, stable, and uniform magnetic field in a test chamber, the magnetic enclosure comprising:

a north portion substantially identical to a south portion disposed in geometric mirroring symmetry opposite to each other and mutually separated apart by an air gap, each one of the north portion and the south portion comprising:
- a permanent magnet shell magnetized in a radial-like orientation and shaped to approximate a hemisphere, the permanent magnet shell having a convex magnet exterior surface and a concave magnet interior surface;
- a ferromagnetic pole piece having a pole piece convex surface disposed in abutting contact with the concave magnet interior surface, and having a pole piece base surface; and
- a ferromagnetic shield having a shield rim from which extend a convex shield exterior surface and a concave shield interior surface that is disposed in abutting contact with the convex magnet exterior surface; and
a ferromagnetic ring disposed in abutting contact with and intermediate between the shield rim of the north portion and the shield rim of the south portion to bridge the air gap and to form the test chamber to which access is provided via at least one aperture opened in the ring.

2. The magnetic enclosure of claim 1, wherein the permanent magnet shell is configured as a hollow hemi-polyhedron having polygonal faces on the convex magnet exterior surface and on the concave magnet interior surface.

3. The magnetic enclosure of claim 2, wherein:
the north portion and the south portion are aligned in mutual geometric mirroring symmetric disposition along a common axis which axis crosses a face on the north permanent magnet assembly identical to a face on the south permanent magnet assembly;
the ring is disposed intermediate between the north portion and the south portion in concentricity with the common axis; and
the at least one aperture in the ring leads into the test chamber.

4. The magnetic enclosure of claim 1, wherein:
the north portion comprises:
- a north shield having a north convex shield exterior surface joining a north concave shield interior surface at a north shield rim;
- a north permanent magnet shell having a north convex magnet exterior surface joining a north concave magnet interior surface at a north magnet rim; and
- a ferromagnetic north pole piece having a north pole piece convex surface joining a north pole piece base surface;

the south portion comprises:
- a ferromagnetic south pole piece having a south pole piece base surface joining a south pole piece convex surface;
- a south permanent magnet shell having a south concave magnet interior surface joining a south convex magnet exterior surface at a south magnet rim; and
- a south shield having a south concave shield interior surface joining a south convex shield exterior surface at a south shield rim;

the north permanent magnet shell has magnetization orientations in directions converging radially-like toward the north pole piece, for lines of magnetic flux to radially-like enter the north pole piece convex surface and to exit perpendicular to and in parallel out of the north pole piece base surface into the test chamber;
the lines of magnetic flux in the test chamber are substantially parallel and enter the south pole piece base surface to exit radially-like out of the south pole piece convex surface into the south permanent magnet shell; and
the south permanent magnet shell has magnetization orientations in directions diverging radially-like outward toward the south shield, for the lines of magnetic flux to pass out of the south permanent magnet shell to the south concave shield interior surface, wherefrom the lines of magnetic flux continue through the ring and therefrom to the north shield, and from the north concave shield interior surface to the north permanent magnet shell to form a closed magnetic flux circuit between the south portion and the north portion, and to form the homogeneous, stable, and uniform magnetic field in the test chamber.

5. The magnetic enclosure of claim 4, wherein the north permanent magnet shell and the south permanent magnet shell form a hollow polyhedron by mutual abutment in aligned disposition of the north magnet rim onto the south magnet rim.

6. The magnetic enclosure of claim 4, wherein each of the ferromagnetic north pole piece and the ferromagnetic south pole piece is configured to operate as a magnetic lens, such that:
lines of magnetic flux received in radial-like distribution on the north pole piece convex surface are realigned to exit out of the north pole piece base surface in parallel alignment distribution; and
lines of magnetic flux received in parallel alignment distribution on the south pole piece base surface are realigned to exit out of the south pole piece convex surface in radial-like distribution.

7. The magnetic enclosure of claim 1, wherein the permanent magnet shell is an assembly of a plurality of right pyramidal frusta, and each one pyramidal frustum out of the plurality of pyramidal frusta has:
a polygonal base disposed in abutting contact with the concave shield interior surface; and
a polygonal top disposed in abutting contact with the pole piece convex surface.

8. The magnetic enclosure of claim 7, wherein:
each one pyramidal frustum has a frustum height, which is a geometrical axis and an axis of magnetization that is co-aligned with the geometrical axis; and
the axis of magnetization of the frusta of the permanent magnet assembly is oriented in radial-like direction respective to the pole piece base surface.

9. The magnetic enclosure of claim 1, wherein the concave shield interior surface of the ferromagnetic cap-like shield is configured to cover the convex magnetic exterior surface in abutting contact coverage selected from a group consisting of partial coverage, complete coverage extending flush with the magnet rim, and complete coverage extending beyond the magnet rim.

10. The magnetic enclosure of claim 9, wherein:
the at least one first aperture is configured to allow introduction of at least one portion of a test object into the test chamber;
at least one second aperture opened in the ring is configured to allow entry and exit into and out of the test chamber; and
the at least one second aperture is disposed relative to the at least one first aperture as one of both in linear continuation thereof and in angular disposition thereto.

11. The magnetic enclosure of claim 10, wherein:
an interior volume is enclosed by the magnetic enclosure; and
the test chamber which is delimited by walls and by the interior surface of the ring is the sole void portion of the magnetic enclosure.

12. The magnetic enclosure of claim 1, wherein the concave magnet interior surface of the permanent magnet shell is configured to cover the pole piece convex surface in abutting contact coverage selected from a group consisting of partial coverage, complete coverage extending flush with the pole piece base surface, and complete coverage extending beyond the pole piece base surface.

13. The magnetic enclosure of claim 1, wherein the pole piece base surface, the magnet rim, and at least a portion of the shield rim form a wall of the test chamber, which wall is one of a planar wall and a non-planar wall.

14. The magnetic enclosure of claim 1, wherein the pole piece is configured to have a pole piece base surface selected alone and in combination from a group of surfaces including a flat planar surface, a concave surface and a convex surface.

15. A method for providing a uniform magnetic field across a test chamber disposed in a magnetic enclosure, the method comprising:
    disposing a north portion substantially identical to a south portion in geometric mirroring symmetry opposite to each other; and
    mutually separating the north portion and the south portion to have an air gap therebetween, wherein providing each one of the north portion and the south portion comprises:
        providing a permanent magnet shell magnetized in a radial-like orientation and shaped to approximate a hemisphere, the permanent magnet shell having a convex magnet exterior surface and a concave magnet interior surface;
        disposing a ferromagnetic pole piece having a pole piece convex surface in abutting contact with the concave magnet interior surface, and having a pole piece base surface;
        providing a ferromagnetic shield having a shield rim from which extend a convex shield exterior surface and a concave shield interior surface that is disposed in abutting contact with the convex magnet exterior surface; and
        disposing a ferromagnetic ring disposed in abutting contact with and intermediate between the shield rim of the north portion and the shield rim of the south portion to bridge the air gap and to form the test chamber to which access is provided via at least one aperture opened in the ring.

16. The method of claim 15, wherein the permanent magnet assembly is configured as a hollow hemi-polyhedron having polygonal faces on the convex magnet exterior surface and on the concave magnet interior surface.

17. The method of claim 16, wherein:
    the north portion and the south portion are aligned in mutual geometric mirroring symmetric disposition along a common axis which axis crosses a face on the north permanent magnet assembly identical to a face on the south permanent magnet assembly;
    the ring is disposed intermediate between the north portion and the south portion in concentricity with the common axis; and
    the at least one aperture in the ring leads into the test chamber.

18. The method of claim 15, wherein:
    the north portion comprises:
        a north shield having a north convex shield exterior surface joining a north concave shield interior surface at a north shield rim;
        a north permanent magnet assembly having a north convex magnet exterior surface joining a north concave magnet interior surface at a north magnet rim; and
        a ferromagnetic north pole piece having a north pole piece convex surface joining a north pole piece base surface;
    the south portion comprises:
        a ferromagnetic south pole piece having a south pole piece base surface joining a south pole piece convex surface;
        a south permanent magnet shell having a south concave magnet interior surface joining a south convex magnet exterior surface at a south magnet rim; and
        a south shield having a south concave shield interior surface joining a south convex shield exterior surface at a south shield rim;
    the north permanent magnet shell has magnetization orientations in converging radially-like toward the north pole piece, for lines of magnetic flux to radially-like enter the north pole piece convex surface and to exit perpendicular to and in parallel out of the north pole piece base surface into the test chamber;
    the lines of magnetic flux in the test being chamber are substantially parallel and enter the south pole piece base surface to exit radially-like out of the south pole piece convex surface into the south permanent magnet shell; and
    the south permanent magnet shell has magnetization orientations in converging radially-like outward toward the south shield, for the lines of magnetic flux to pass out of the south permanent magnet shell to the south concave shield interior surface, wherefrom the lines of magnetic flux continue through the ring and therefrom to the north shield, and from the north concave shield interior surface to the north permanent magnet shell to form a closed magnetic flux circuit between the south portion and the north portion, and to form a homogeneous, stable, and uniform magnetic field in the test chamber.

19. The method of claim 18, wherein the north permanent magnet shell and the south permanent magnet shell form a hollow polyhedron by mutual abutment in aligned disposition of the north magnet rim onto the south magnet rim.

20. The method of claim 19, wherein each of the ferromagnetic north pole piece and the ferromagnetic south pole piece is configured to operate as a magnetic lens, such that:
    lines of magnetic flux received in radial-like distribution on the north pole piece convex surface are realigned to exit out of the north pole piece base surface in parallel alignment distribution; and
    lines of magnetic flux received in parallel alignment distribution on the south pole piece base surface are realigned to exit out of the pole piece convex surface in radial-like distribution.

21. The method of claim 15, wherein the permanent magnet shell is an assembly of a plurality of right pyramidal frusta, and each one pyramidal frustum out of the plurality of pyramidal frusta has:
    a polygonal base disposed in abutting contact with the concave shield interior surface; and
    a polygonal top disposed in abutting contact with the pole piece convex surface.

22. The method of claim 21, wherein:
    each one pyramidal frustum has a frustum height, which is a geometrical axis and an axis of magnetization that is co-aligned with the geometrical axis; and
    the axis of magnetization of the frusta of the permanent magnet assembly is oriented in radial-like direction respective to the pole piece base surface.

23. The method of claim 15, wherein the concave shield interior surface of the ferromagnetic cap-like shield is configured to cover the convex magnetic exterior surface in abutting contact coverage selected from a group consisting of partial coverage, complete coverage extending flush with the magnet rim, and complete coverage extending beyond the magnet rim.

24. The method of claim 23, wherein:
the at least one first aperture is configured to allow introduction of at least one portion of a test object into the test chamber;
at least one second aperture opened in the ring is configured to allow entry and exit into and out of the test chamber; and
the at least one second aperture is disposed relative to the at least one first aperture as one of both in linear continuation thereof and in angular disposition thereto.

25. The method of claim 24, wherein:
an interior volume is enclosed by the magnetic enclosure; and
the test chamber which is delimited by walls and by the interior surface of the ring is the sole void portion of the magnetic enclosure.

26. The method of claim 15, wherein the concave magnet interior surface of the permanent magnet shell is configured to cover the pole piece convex surface in abutting contact coverage selected from a group consisting of partial coverage, complete coverage extending flush with the pole piece base surface, and complete coverage extending beyond the pole piece base surface.

27. The method of claim 15, wherein the pole piece base surface, the magnet rim, and at least a portion of the shield rim form a wall of the test chamber, which wall is one of a planar wall and a non-planar wall.

28. The method of claim 15, wherein the pole piece is configured to have a pole piece base surface selected alone and in combination from a group of surfaces including a flat planar surface, a concave surface and a convex surface.

29. A magnetic enclosure having two permanent magnet structures providing a homogeneous, stable, and uniform magnetic field in a test chamber, the magnetic enclosure comprising:
a north portion substantially identical to a south portion disposed in geometric mirroring symmetry opposite to each other and mutually separated apart by an air gap, each one of the north portion and the south portion comprising:
a permanent magnet assembly magnetized in a radial-like orientation and having practically a continuous convex magnet exterior surface and a concave magnet interior surface shaped as a shell of a polyhedron to approximate a hemisphere;
a ferromagnetic pole piece configured as a magnetic lens, the pole piece having a pole piece convex surface disposed in abutting contact with the concave magnet interior surface, and having a pole piece base surface; and
a ferromagnetic shield having a shield rim from which extend a convex shield exterior surface and a concave shield interior surface that is disposed in abutting contact with the convex magnet exterior surface; and
a ferromagnetic ring disposed in abutting contact with and intermediate between the shield rim of the north portion and of the south portion, the ring being configured to:
form a return path between the two permanent magnet structures; and
provide access to the test chamber via at least one aperture opened in the ring.

30. A magnetic enclosure having two permanent magnet structures providing a homogeneous, stable, and uniform magnetic field in a test chamber, the magnetic enclosure comprising:
a north portion substantially identical to a south portion disposed in geometric mirroring symmetry opposite to each other and mutually separated apart by an air gap, each one of the north portion and the south portion comprising:
a permanent magnet assembly magnetized in a radial-like orientation and having practically a continuous convex magnet exterior surface and a concave magnet interior surface shaped as a shell of a polyhedron to approximate a hemisphere;
a ferromagnetic pole piece configured appropriately as one of a convergent and a divergent magnetic lens, the pole piece having a pole piece convex surface disposed in abutting contact with the concave magnet interior surface, and having a pole piece base surface; and
a ferromagnetic shield having a shield rim from which extend a convex shield exterior surface and a concave shield interior surface that is disposed in abutting contact with the convex magnet exterior surface; and
a ferromagnetic ring disposed in abutting contact with and intermediate between the shield rim of the north portion and of the south portion, the ring having at least one aperture providing access to the test chamber, and being configured to form a return path between the two permanent magnet structures.

31. The magnetic enclosure of claim 30, wherein the pole piece base surface is disposed to protrude away from the shield rim to facilitate access to in between the pole piece base surfaces.

32. The magnetic enclosure of claim 31, wherein the shield rim is recessed relative to the pole piece base surface to facilitate access to in between the pole piece base surfaces.

33. The magnetic enclosure of claim 30, wherein the at least one aperture in the ring is formed by removing a portion of the ring.

34. The magnetic enclosure of claim 30, wherein:
the pole piece base surface is disposed to protrude away from the shield rim; and
the at least one aperture in the ring is formed by removing a portion of the ring, whereby access to in between the pole piece base surfaces is facilitated.

* * * * *